United States Patent [19]
Vandenheuvel et al.

[11] Patent Number: 5,614,759
[45] Date of Patent: Mar. 25, 1997

[54] AUTOMATED ASSEMBLY OF SEMICONDUCTOR DEVICES USING A PAIR OF LEAD FRAMES

[75] Inventors: William Vandenheuvel, Ft. Salonge, N.Y.; Johannes Vandenbroeke, Andover, Mass.

[73] Assignee: General Instrument Corp., Hatboro, Pa.

[21] Appl. No.: 579,232

[22] Filed: Dec. 28, 1995

Related U.S. Application Data

[62] Division of Ser. No. 274,009, Jul. 12, 1994, Pat. No. 5,506,174.

[51] Int. Cl.$^6$ ................................................ H01L 23/495
[52] U.S. Cl. .......................... 257/666; 257/669; 257/674; 257/676
[58] Field of Search .................................. 257/666, 669, 257/674, 676

[56] References Cited

U.S. PATENT DOCUMENTS

| | | | |
|---|---|---|---|
| 3,602,985 | 9/1971 | Nosch | 437/216 |
| 3,702,954 | 11/1972 | Mosch et al. | 257/624 |
| 4,084,312 | 4/1978 | Kirk et al. | 437/219 |
| 4,994,412 | 2/1991 | Kalfus et al. | 437/220 |
| 5,068,206 | 11/1991 | Kurita et al. | 437/220 |
| 5,166,098 | 11/1992 | Micic et al. | 437/219 |
| 5,208,481 | 5/1993 | Kurita et al. | 257/669 |
| 5,334,553 | 8/1994 | Popat et al. | 437/211 |
| 5,337,216 | 8/1994 | McIver | 437/218 |
| 5,343,072 | 8/1994 | Imai et al. | 257/666 |
| 5,506,174 | 4/1996 | Vandenheuvel et al. | 437/209 |

FOREIGN PATENT DOCUMENTS

| | | | |
|---|---|---|---|
| 0073387 | 4/1986 | Japan | 257/666 |

*Primary Examiner*—Sara W. Crane
*Assistant Examiner*—David Ostrowski

[57] ABSTRACT

Semiconductor rectifier devices having oppositely extending terminals lying in a common plane are fabricated using upper and lower lead frames each comprising a pair of parallel side rails and spaced apart cross bars extending between the side rails. Cantilevered terminals are mounted along the cross bars. The cross bars of the upper frame lie in a plane downwardly off-set from the plane of the upper frame, and the cross bars of the lower frame lie in a plane upwardly off-set from the plane of the lower frame. Free ends of the terminals of the upper frame lie in a plane upwardly off-set from the plane of the upper frame cross bars, and free ends of the terminals of the lower frame are off-set downwardly from the plane of the lower frame cross bars. Semiconductor chips are mounted on the terminal free ends of the lower frame, and the upper frame is disposed on top of the lower frame with the upper frame terminals contacting the chips. The chips are bonded to the terminals and the individual rectifiers are encapsulated and severed from the frame assembly. The rectifiers include two, in-plane extending terminals.

6 Claims, 3 Drawing Sheets

AUTOMATED ASSEMBLY OF SEMICONDUCTOR DEVICES USING A PAIR OF LEAD FRAMES

This is a divisional of application Ser. No. 08/274,009 filed on Jul. 12, 1994, now U.S. Pat. No. 5,506,174.

BACKGROUND OF THE INVENTION

This invention relates to the automated assembly of semiconductor devices, and particularly to an assembly process using two lead frames.

Lead flames are known in the semiconductor industry and, typically, are used in the fabrication of integrated circuits. Although the lead frames used according to the present invention differ from known lead frames, as hereinafter disclosed, known lead frame fabrication techniques and materials can be used in the practice of the present invention, hence the term "lead frame" is herein adopted.

The present invention has particular utility in the fabrication of semiconductor rectifiers of the type comprising a semiconductor chip having top and bottom surfaces, an anode terminal connected to one of the chip surfaces and a cathode terminal connected to the other chip surface. Each terminal extends laterally beyond the surface to which it is attached and has a portion bent to extend along a side of the chip to a mid-plane of the chip and then laterally away from the chip in such mid-plane. A complete semiconductor rectifier includes a housing, e.g., of a molded resin, completely encapsulating the chip and substantially all of the anode and cathode terminals with the exception of portions of the terminals which extend laterally outwardly from the device housing and provide means for electrically connecting to and mounting the device. The terminals extend in opposite directions from the device in a common plane.

An advantage of the in-plane arrangement of the terminals is that it facilitates mounting of the rectifier on a printed circuit board. For example, the rectifier can be machine inserted into an opening through a printed circuit board and automatically seated therein with the in-plane terminals pressed against a surface of the circuit board. By means of pre-applied solder layers, the terminals are then bonded to printed circuit paths on the circuit board which underlie and are contacted by the terminals.

Heretofore, rectifiers of the type described have been assembled more or less manually, e.g., by successively disposing one terminal, the chip and then the other terminal into proper positioned and contacting relationship within a jig, and then simultaneously soldering together the device parts.

The present invention is concerned with automated fabrication of semiconductor devices, and particularly to the fabrication of rectifier devices of the type described.

SUMMARY OF THE INVENTION

The fabrication process utilizes two lead frames e.g., elongated sheets of metal which are patterned to provide a plurality of spaced apart and identical device components. In a preferred embodiment, each flame comprises a pair of spaced apart side rails lying in a common plane, and a plurality of spaced apart cross bars connected to and extending between the side rails. Spaced along each cross bar and extending laterally therefrom is a plurality of cantilevered, elongated terminals.

In the fabrication process, the two frames are disposed one on top of the other with the cross bars of the upper frame parallel to the cross bars of the lower frame and interdigitated therewith. That is the cross bars of the upper frame do not directly overlie the cross bars of the lower frame but overlie the spaces between the lower frame cross bars.

Prior to overlapping the two flames, each frame is provided with two sets of L-shaped bends. In the upper frame, all of the cross bars, where they join the side rails, are bent so that the planes of the cross bars are below the plane of the side rails a distance equal to one-half the thickness of the frame metal sheets. Also, in the upper frame, all of the extending terminals are bent, intermediate the ends thereof, so that the planes of the leading ends of the terminals are above the planes of the cross bars.

Conversely, in the lower frame, the two sets of L-shaped bends are such that the cross bars lie in a common plane above the lower frame side rails, and the leading ends of the terminals lie in a common plane below the plane of the cross bars.

In the assembly process, a semiconductor chip is mounted on the upper surface of each of the leading ends of the lower frame terminal. The upper frame is then disposed over the lower frame as previously described, that is, with the spaced apart cross bars of the upper frame interdigitated with the cross bars of the lower frame. Owing to the downward off-set of the upper frame cross bars and the upward off-set of the lower frame cross bars, all the cross bars of both flames lie in a common plane which is mid-way between the planes of the side rails of the overlapped flames.

Additionally, the leading ends of the terminals of the upper frame overlie the leading ends of the terminals of the lower frame but are spaced thereabove a distance determined by the off-set distances of the terminal leading end planes from the cross bar planes. This distance is just slightly less than the thickness of the chips mounted on the lower frame terminal ends, whereby the upper frame terminal ends make firm contact with the upper surfaces of the chips.

The terminals of the upper frame are then bonded to the chip upper surfaces.

Thereafter, the chips and contacting terminal ends are encapsulated within housings with rear ends of the terminals extending laterally from the housings. The extending terminal portions, lying in the plane of the cross bars, are severed from the cross bars to provide completed rectifiers of the type above-described.

DESCRIPTION OF PREFERRED EMBODIMENT OF THE INVENTION

Figure 1:
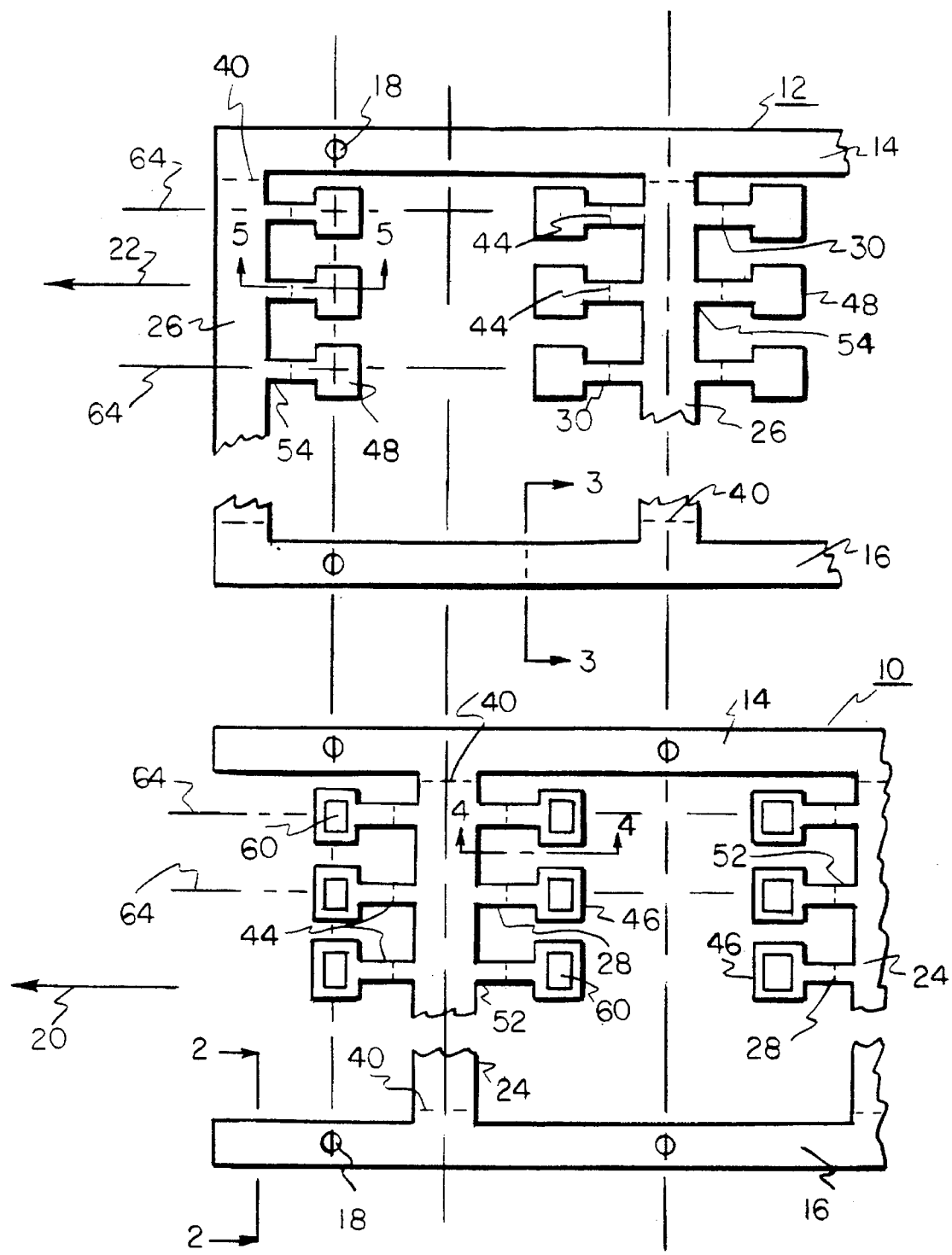
FIG. 1 is a plan view of two lead flames of a type used in accordance with this invention.

FIG. 1 shows two side by side lead flames 10 and 12. As previously noted, lead flames of a type generally similar to the lead flames used according to this invention are known. Typically, such lead frames are used in the fabrication of integrated circuits employing semiconductor chips having, on a small surface area, a large number of terminal areas to which terminal wires are to be bonded. The known lead frames include a plurality of cantilevered leads extending from opposite directions towards a central open area of each frame. The semiconductor chip is disposed within the frame open area, e.g., by means of a jig, with the leading ends of the leads extending towards opposite sides of the chip. Depending upon the device dimensions, the lead ends can overlie the chip edges and be directly bonded to the chip terminal areas, or lead wires can be bonded between the terminal areas and the lead ends. In some instances, one of the lead ends is bent downwardly from the plane of the frame and extends under the central open area of the frame to provide a mounting pad for the chip. An example of such a known lead frame and its use in the fabrication of semiconductor devices is shown in U.S. Pat. No. 5,223,739, issued Jun. 29, 1993, the subject matter of which is incorporated herein by reference.

Returning to FIG. 1, each lead frame 10 and 12 comprises a patterned, elongated sheet of metal, e.g., of copper, having a thickness of 5 mils, and each frame includes a plurality of groups of device components whereby "batch" processing techniques can be used. That is, groups of identical rectifier devices are simultaneously fabricated according to the invention.

Each of the lead frames comprises a pair of spaced apart side rails 14 and 16, with each rail including feeding and positioning openings 18 whereby the various flames can be mounted for precise in-step movements along parallel paths 20 and 22 past and through various work stations. Various apparatus for precisely indexing and performing various processes on and in connection with lead frames are well known in the semiconductor industry, hence are not illustrated herein.

Extending between each pair of side rails 14 and 16 of each frame 10 and 12 are spaced apart cross bars 24 and 26, respectively, and each cross bar includes a plurality of cantilevered terminals 28 and 30, respectively, extending therefrom.

In this embodiment of the invention, each terminal on each frame defines a location where a complete rectifier device is to be made. As described hereinafter, each rectifier device includes one terminal from each frame. Also, the various terminals, after encapsulation of the individual devices, are severed from their respective frames.

The lead flames 10 and 12 can be formed using known stamping processes or, where particularly small dimensions are required, by known photolithographic processes.

Figure 2:
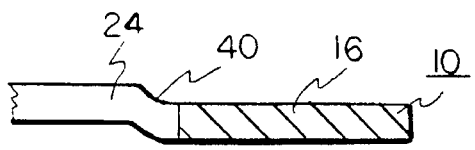
FIGS. 2–5 are cross-sectional views taken along lines 2—2, 3—3, 4—4 and 5—5, respectively of FIG. 1.
Figure 3:
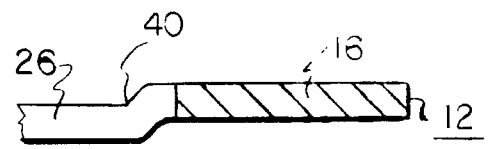

As shown in FIGS. 2, 3, 4 and 5, each frame 10 and 12 is provided with two sets of L-shaped bends. FIGS. 2 and 3 show a bend 40 of one set of bends for the two frames 10 and 12. Each bend 40 is disposed, as indicated by pairs of dashed lines in FIG. 1, where the cross bars 24 and 26 of the frames are connected to the side rails 14 and 16 of the flames. By virtue of the various bends 40, all the cross bars 24 of the lower frame 10 (FIG. 2) lie in a plane which is parallel to but slightly above the plane of the side rails 14 and 16 of the lower frame.

Similarly, all of the cross bars 26 of the upper frame 12 (FIG. 3) lie in a common plane which is parallel to the plane of the upper frame side rails 14 and 16 but off-set slightly below the side rail plane.

By "planes" is meant planes parallel to, and mid-way between, the upper and lower surfaces of any member being discussed, i.e., the side rails, the cross bars and the terminals.

In the embodiment illustrated in FIGS. 2 and 3, the off-sets of the cross bar planes from the planes of the side rails of each frame are equal to one-half the thickness of the lead frame plates. Using 5 rail thickness plates, as previously noted, the off-set of the cross bar planes from the planes of the side rails is 2.5 mils.

Figure 7:
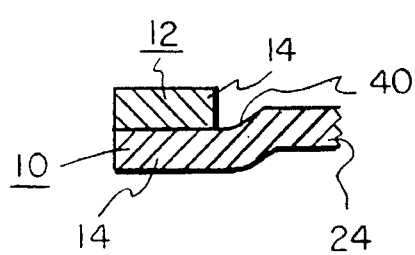
FIGS. 7 and 8 are cross-sectional views taken along lines 7—7 and 8—8 of FIG. 6.

To slightly leap ahead in the description, the purpose of the off-sets of the cross bars is to dispose the cross bars 24 and 26 of both frames in a common plane (FIG. 8) when the two frames are disposed one on top of the other. When so disposed (FIG. 7), the upper surfaces of the side rails of the lower frame 10 are firmly pressed against the bottom surfaces of the side rails of the upper frame 12.

In another embodiment, not illustrated, only one set of cross bars, e.g., the cross bars 26 on the upper frame 12, are off-set out of the plane of the frame side rails. However, the off-set is equal to the thickness of the plates of the two frames, e.g., 5 mils. Thus, when the two frames are disposed in overlapped relationship, the cross bars of the upper frame, interdigitated with the cross bars of the lower frame, lie in the plane of the lower frame cross bars.

Figure 4:
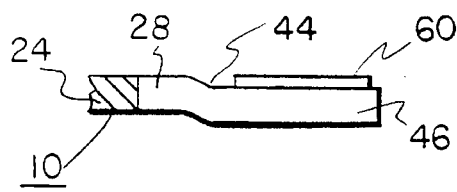
Figure 5:
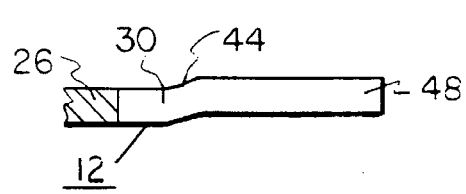

Returning to the description of the L-shaped bends provided in the two flames, FIGS. 4 and 5 show a second set of bends 44. These bends, shown also in FIG. 1 by dashed lines, are disposed intermediate the free ends 46 and 48 of the cantilevered terminals 28 and 30, respectively, and the terminal "rear" ends 52 and 54 secured to the cross bars 24 and 26, respectively.

In the lower frame 10, the L-shaped bends 44 dispose (FIG. 4) all the terminal leading ends 46 in a common plane beneath the plane of the cross bars 24.

In the upper frame 12, the L-shaped bends 44 dispose (FIG. 5) all the terminal leading ends 48 in a common plane above the plane of the cross bars 26.

The off-set provided by each of the bends 44 is equal to just lightly less than one-half the thickness of the semiconductor chip 60 (FIG. 4) used in the rectifier devices being made. In one example, the chip 60 (as described hereinafter) has a thickness of 12 mils and the off-set provided by the bends 44 is 15 mils.

The use of the two flames 10 and 12, provided with the two sets of bends 40 and 44, in the fabrication of semiconductor rectifier devices is now described.

In FIG. 1, the two frames 10 and 12 are disposed in precise left to right alignment with one another along their respective paths 20 and 22. The cross bars of each frame are aligned with spaces between the cross bars of the other frame. In this embodiment, the cantilevered terminals 28 and 30 of the two flames 10 and 12 extend parallel to the paths 20 and 22 of movements of the two frames, and a central axis 64 of elongation of the terminals 28 and 30 is shown by dashed lines. When the two flames 10 and 12 are disposed in overlapped relationship (FIG. 6), the left to right alignment shown in FIG. 1 is maintained, and the horizontal axes 64 of each pair of overlapped terminals 28 and 30 are aligned in vertical planes.

Prior to assembling the two frames together, a semiconductor chip 60 (FIG. 1 ) is solder bonded to the leading end 46 of each of the terminals 28 of the lower frame 10. The upper surface of each chip 60 is provided with a layer of solder. Previously, the chip thickness was referred to in connection with the off-set (FIGS. 3 and 4) provided by the L-shaped bends 44. By chip "thickness" is meant the distance from the upper surface of the terminal leading end 46 on which the chip 60 is solder bonded to the upper surface of the solder layer on the chip upper surface. It is this distance which determines the contacting relationship (FIG. 8) of the terminal ends 48 of the upper frame 12 with the chip upper surfaces when the frames are assembled together.

Figure 6:
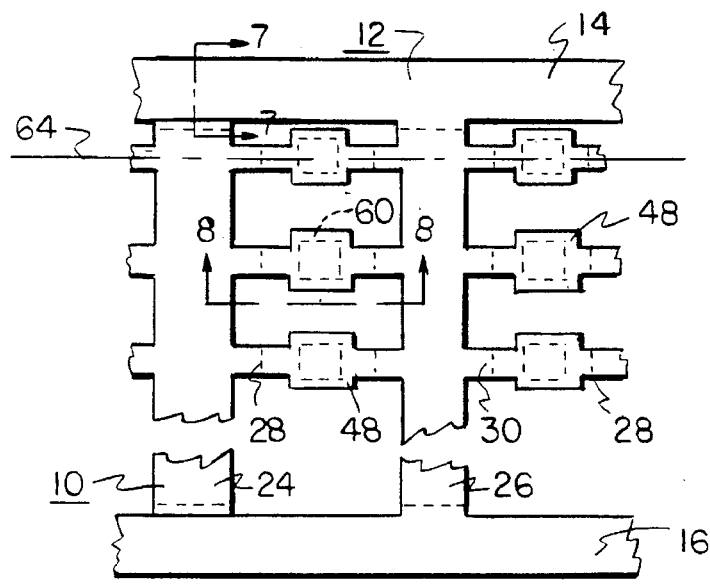
FIG. 6 is a plan view showing a portion of the lead frame assembly formed when the two lead flames shown in FIG. 1 are disposed one on top of the other and in the same left-to-fight alignment as shown in FIG. 1.

After bonding of the chips 60 to the lower frame 10, the upper frame 12 is disposed on top of the lower frame 10. This is shown in FIG. 6. As previously indicated, the various cross bars 24 and 26 of the two flames 10 and 12 are interdigitated with one another; that is, they alternate along the left to right direction of the assembly.

The side rails 14 and 16 of the two flames are disposed in firm contacting, overlapped relationship (FIG. 7) and, because of the L-shaped bends 40 in the cross bars, all the cross bars 24 and 26 (FIG. 8) lie in a common plane.

As previously noted, apparatus suitable for positioning, advancing and overlapping the two flames can be designed and made using known technology, hence suitable apparatus for performing these functions is not described. Also, the various positioning functions can be performed manually.

Figure 8:
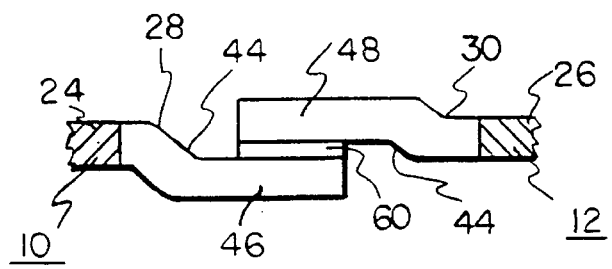

FIG. 8 shows that the leading ends 48 of the terminals 30 on the upper frame 12 overlie and contact the upper surfaces of the semiconductor chips 60 mounted on the corresponding terminal ends 46 of the lower frame 10. The extending terminals 28 and 30 are relatively flexible, and some flexure occurs when the upper terminals contact the chip upper surfaces. This provides a firm contacting relationship notwithstanding manufacturing tolerances.

The assembled together lead flames are then heated for solder bonding the upper frame terminal ends 48 to the semiconductor chips. Preferably, the solder used on the chip upper surfaces has a lower fusing temperature than the solder used on the chip lower surfaces whereby the heating of the flames for chip upper surface bonding does not soften the previously made chip lower surface bonds.

After soldering, the basic semiconductor rectifiers are completed with each rectifier comprising a semiconductor chip 60 bonded between two terminals 28 and 30.

The next processes can be in accordance with known technology, e.g., of the type used in the fabrication of integrated semiconductor devices using lead flames.

Figure 9:
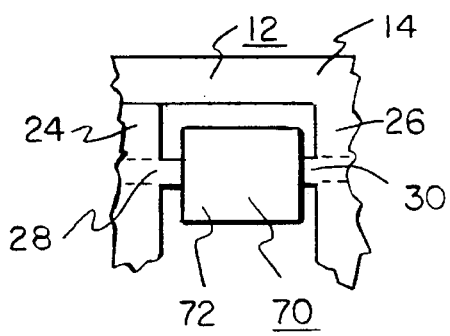
FIG. 9 is a partial view of the lead frame assembly shown in FIG. 6 showing a single rectifier device encapsulated in a molded housing.
Figure 10:
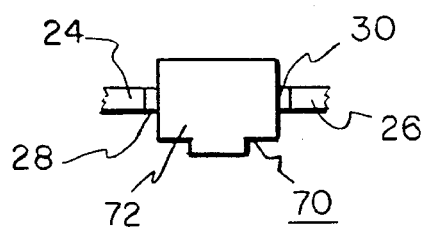
FIG. 10 is a side elevation of the rectifier device shown in FIG. 9.

Thus, the assembled and bonded lead flames are disposed in a mold and a known packaging resin is forced into the mold under pressure. The resin flows around and completely encapsulates each chip 60 and the portions of the two terminals 28 and 30 bonded thereto. Upon hardening of the resin and the opening of the mold, each completed rectifier device 70 appears as shown in FIGS. 9 and 10 which show but one such device. Each device 70 comprises a solid resin envelope 72 having two terminals 28 and 30 extending therefrom. The L-shaped bends 44 (FIG. 8) in the terminals 28 and 30 are disposed within the envelope 72 with the result that the two terminals 28 and 30 lie in a common plane as shown in the side elevational view of FIG. 10.

Figure 11:
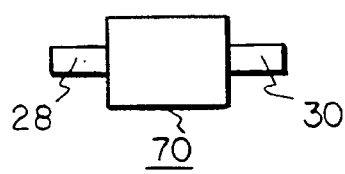
FIG. 11 is a view similar to FIG. 9 but showing a rectifier device separated from the lead frame assembly.

FIGS. 9 and 10 show the two terminals 28 and 30 still connected to the corresponding frame cross bars 24 and 26, respectively. To complete the manufacturing process, the two terminals 28 and 30 are cut to separate the individual rectifier devices 70 from the frame assembly. A resulting device is shown in FIG. 11. In the cutting process, the cross bars 24 and 26 between which the device 70 was suspended (FIGS. 9 and 10) are cut along the dashed lines in FIG. 9. Thus, the terminals 28 and 30 shown in FIG. 11 have longer lengths than the terminals 28 and 30 shown in FIGS. 9 and 10.

Figure 12:
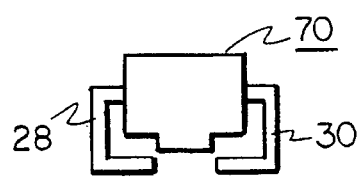
FIGS. 12 and 13 are views similar to FIG. 10 but showing two configurations into which the device terminals are formed.
Figure 13:
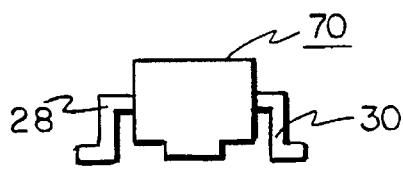

As indicated in FIGS. 9–11, the entire lengths of the device terminals 28 and 30 lie in a common plane. Typically, however, the terminal leads 28 and 30 of the devices 70, which can have identical shape and dimensions of prior art devices made using prior art processes, are bent into various configurations such as shown in FIGS. 12 (C-bend) and 13 (gull wing). Such configurations are useful, as known, for facilitating mounting of the devices on printed circuit boards.

What is claimed is:

1. A lead frame assembly for the batch fabrication of semiconductor rectifiers comprising upper and lower lead frames, each of said frames comprising a side rail, a first cross bar extending transversely within a first plane from said side rail, and a plurality of terminals spaced along said cross bar and extending therefrom, each of said terminals having a rear end secured to said cross bar and a free end spaced from said cross bar, said upper frame being disposed on said lower frame with the cross bars of said frames being disposed in side by side co-planar relationship within said first plane with each terminal of one cross bar extending towards a corresponding terminal of the other cross bar and in overlapped relationship therewith, and a semiconductor chip sandwiched between and bonded to the free ends of each pair of overlapped terminals.

2. A lead frame assembly according to claim 1 wherein the free ends of the terminals of said upper frame lie in a second plane off-set above said first plane, and the free ends of the terminals of said lower frame lie in a third plane off-set below said first plane.

3. A lead frame assembly according to claim 2 wherein said rear ends of all of said terminals lie in said first plane.

4. A lead frame assembly according to claim 3 wherein all of said terminals include a bend intermediate said free and said rear ends thereof, and wherein each of said chips and the corresponding pair of terminal free ends and corresponding terminal bends are encapsulated within a respective one of a plurality of housings, the rear ends of said terminals extending outwardly from said housings.

5. A lead frame according to claim 1 wherein each of said flames includes a second cross bar identical to said first cross bar but spaced therefrom along said side rail, and said first and second cross bars of said upper frame are disposed in alternating relationship with said first and second cross bars of said lower frame.

6. A lead frame assembly for the batch fabrication of semiconductor devices comprising upper and lower lead flames, said upper frame comprising a pair of spaced apart and parallel rails lying in a first plane and including a plurality of spaced apart first cross bars extending transversely to and between said upper frame rails, each of said first cross bars having oppositely disposed ends connected to respective rails of said upper frame and a central portion between said ends lying in a second plane spaced below said first plane, and each of said first cross bars including a plurality of first terminals spaced along said central portion and extending therefrom, each of said first terminals having a rear end secured to a respective first cross bar and a free end spaced therefrom, all of said free ends of said first terminals lying in a third plane spaced above said second plane, said lower rail comprising a pair of spaced apart and parallel rails lying in a fourth plane and including a plurality of spaced apart second cross bars extending transversely to and between said lower frame rails, each of said second cross bars having oppositely disposed ends connected to respective rails of said lower frame and a central portion between said ends lying in a fifth plane spaced above said fourth plane, and each of said second cross bars including a plurality of second terminals spaced along said central portion and extending therefrom, each of said second terminals having a rear end secured to a respective second cross bar and a free end spaced therefrom, all of said free ends of said second terminals lying in a sixth plane spaced below said fifth plane, a semiconductor chip mounted on each of the free ends of one of said first and second terminals, and said upper frame being disposed on top of said lower frame with: a) said central portions of said first and second cross-bars lying in a common plane disposed between said first and fourth planes and in interdigitated, alternating relationship; b) the first terminals on each first cross bar of said upper frame extending towards and overlapping respective second terminals of a second cross bar immediately adjacent to said each first cross bar; and c) with a respective one of said chips sandwiched and bonded between each pair of overlapping terminal flee ends.

\* \* \* \* \*